(12) United States Patent
Wang et al.

(10) Patent No.: US 7,884,017 B2
(45) Date of Patent: Feb. 8, 2011

(54) THERMAL METHODS FOR CLEANING POST-CMP WAFERS

(75) Inventors: Zhonghui Alex Wang, San Jose, CA (US); Tiruchirapalli Arunagiri, Newark, CA (US); Fritz C. Redeker, Fremont, CA (US); Yezdi Dordi, Palo Alto, CA (US); John Boyd, Ottawa (CA); Mikhail Korolik, San Jose, CA (US); Arthur M. Howald, Pleasanton, CA (US); William Thie, Sunnyvale, CA (US); Praveen Nalla, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/699,518

(22) Filed: Feb. 3, 2010

(65) Prior Publication Data

US 2010/0136788 A1 Jun. 3, 2010

Related U.S. Application Data

(62) Division of application No. 11/801,269, filed on May 8, 2007, now Pat. No. 7,709,400.

(51) Int. Cl.
*H01L 21/44* (2006.01)
*H01L 21/31* (2006.01)
*H01L 21/469* (2006.01)
*H01L 21/24* (2006.01)
*H01L 21/40* (2006.01)

(52) U.S. Cl. .................. 438/678; 438/540; 438/770

(58) Field of Classification Search .............. 438/770, 438/540; 257/E21.284
See application file for complete search history.

(56) References Cited

U.S. PATENT DOCUMENTS

| 5,773,132 A | 6/1998 | Blumberg et al. |
| 6,127,282 A | 10/2000 | Lopatin |
| 6,717,189 B2 | 4/2004 | Inoue et al. |

(Continued)

FOREIGN PATENT DOCUMENTS

KR 10-2001-0089722 10/2001

(Continued)

OTHER PUBLICATIONS

Christensen, T. M. et al., "Thermal Stability of Benzotriazole on Copper during Atmospheric Corrosion", Surface and Interface Analysis, vol. 17, 3-6 (1991).

(Continued)

*Primary Examiner*—Alexander G Ghyka
*Assistant Examiner*—Seahvosh J Nikmanesh
(74) *Attorney, Agent, or Firm*—Schwegman, Lundberg & Woessner, P.A.

(57) ABSTRACT

Methods for cleaning semiconductor wafers following chemical mechanical polishing are provided. An exemplary method exposes a wafer to a thermal treatment in an oxidizing environment followed by a thermal treatment in a reducing environment. The thermal treatment in the oxidizing environment both removes residues and oxidizes exposed copper surfaces to form a cupric oxide layer. The thermal treatment in the reducing environment then reduces the cupric oxide to elemental copper. This leaves the exposed copper clean and in condition for further processing, such as electroless plating.

3 Claims, 3 Drawing Sheets

U.S. PATENT DOCUMENTS

| | | | |
|---|---|---|---|
| 6,878,628 | B2 | 4/2005 | Sophie et al. |
| 6,902,605 | B2 | 6/2005 | Kolics et al. |
| 7,709,400 | B2 | 5/2010 | Wang et al. |
| 2001/0053591 | A1 | 12/2001 | Buchwalter et al. |
| 2003/0157774 | A1 | 8/2003 | Tominari et al. |
| 2005/0158999 | A1 | 7/2005 | Lin et al. |
| 2008/0280456 | A1 | 11/2008 | Wang et al. |

FOREIGN PATENT DOCUMENTS

| | | |
|---|---|---|
| KR | 10-2002-0025806 | 4/2002 |
| WO | WO-2008140697 A1 | 11/2008 |

OTHER PUBLICATIONS

Kirsch, P. D. et al., "Chemical and thermal redection of thin films of cooper (II) oxide and copper (I) oxide", Jrnl. of Applied Physics, vol. 90, No. 8, Oct. 15, 2001, pp. 4256-4264.

Kim, J. Y., et al., "Reduction of CuO and Cu2O with H2: H Embedding and Kinetic Effects in the Formation of Suboxides", J. Am. Chem. Soc. 2003, 125, 10684-10692.

Hymes, S., et al., "Surface cleaning of copper by thermal and plasma treatment in reducing and inert ambients", J. Vac. Sci. Technol. B 16(3), May/Jun. 1998, pp. 1107-1109.

Christensen, T. M., et al., "Thermal Stability of Benzotriazole on Copper during Atmospheric Corrosion", *Surface and Interface Analysis*, vol. 17, (1991), 3-6.

Hymes, S., et al., "Surface cleaning of copper by thermal and plasma treatment in reducing and inert ambients", *J. Vac. Sci. Technol. B* 16(3), (May/Jun. 1998), 1107-1109.

Kim, J. Y., et al., "Reduction of CuO and Cu2O with H2: H Embedding and Kinetic Effects in the Formation of Suboxides", *J. Am. Chem. Soc.* 125, (2003), 10684-10692.

Kirsch, P D., et al., "Chemical and thermal reduction of thin films of copper (II) oxide and copper (I) exide", *Jrnl. of Applied Physics*, vol. 90, No. 8, (Oct. 15, 2001), 4256-4264.

THERMAL METHODS FOR CLEANING POST-CMP WAFERS

RELATED APPLICATION

The present application is a divisional of U.S. patent application Ser. No. 11/801,269, filed on May 8, 2007, which is incorporated herein by reference in its entirety.

BACKGROUND OF THE INVENTION

1. Field of the Invention

The present invention relates generally to the field of semiconductor device fabrication and more particularly to wafer cleaning.

2. Description of the Prior Art

Semiconductor devices, including the Back-End of Line (BEoL) interconnect structures thereof, include conductive lines and other features that are formed from copper. During semiconductor device fabrication on a wafer, the copper is typically deposited within trenches or vias defined in a dielectric layer. The copper and dielectric layers are then planarized to provide a smooth and planar surface on which to deposit additional layers. A common method for planarizing is chemical mechanical planarization (CMP). CMP processes typically leave a residue on the exposed surface of the wafer that must be removed prior to the formation of subsequent layers.

Typical approaches to removing the CMP residue involve washing the wafer. For example, the wafer can be washed first in an acidic solution and then in a basic solution, or first in a basic solution followed by an acidic solution. However, these methods are disadvantageous as they tend to remove copper, leaving the copper features recessed with respect to the surrounding dielectric layer. Other methods for removing the CMP residue expose the wafer to an energetic plasma to etch away the residue.

What is provided by the present invention are novel methods for removing CMP residue that do not harm either the exposed copper or the dielectric layer.

SUMMARY

An exemplary post-CMP cleaning method comprises treating a wafer in a gas-phase oxidizing environment at a temperature above about 100° C., then treating the wafer in a gas-phase reducing environment at a temperature above about 100° C. Treating the wafer in the oxidizing environment can include treating the wafer in an atmosphere comprising $O_2$ or $O_3$ while treating the wafer in the reducing environment can include treating the wafer in an atmosphere comprising $H_2$. The method can further comprise treating the wafer with a basic solution prior to treating the wafer in the oxidizing environment. The basic solution can have a pH in the range of about 8 to about 11, for example, and in some embodiments comprises tetramethyl ammonium hydroxide.

The present invention also provides a method for cleaning a post-CMP wafer that includes a conductive feature having a $Cu_2O$ surface layer. This exemplary method comprises oxidizing the $Cu_2O$ surface layer in a first gas-phase environment to form a CuO surface layer, then reducing the CuO surface layer in a second gas-phase environment to elemental Cu. Oxidizing the $Cu_2O$ surface layer can comprise treating the wafer in an atmosphere including $O_2$ or $O_3$ at a temperature above about 100° C., while reducing the CuO surface layer can comprise treating the wafer in an atmosphere including $H_2$ at a temperature above about 100° C. The method can further comprise substantially removing a residue layer with a basic solution prior to oxidizing the $Cu_2O$ surface layer.

Another method of the invention is directed to selectively forming a capping layer over a conductive feature of a wafer. This exemplary method comprises cleaning the wafer and forming the capping layer selectively over the conductive feature by electroless deposition. In this method, cleaning the wafer can include oxidizing a $Cu_2O$ surface layer of the conductive feature in a first gas-phase environment to form a CuO surface layer, then reducing the CuO surface layer in a second gas-phase environment to element Cu. In some embodiments, the capping layer comprises cobalt or a cobalt alloy.

DETAILED DESCRIPTION OF THE INVENTION

The present invention provides methods for cleaning semiconductor wafers following chemical mechanical polishing. An exemplary method exposes a wafer to a thermal treatment in an oxidizing environment followed by a thermal treatment in a reducing environment. The thermal treatment in the oxidizing environment both removes residues and oxidizes exposed copper surfaces to form a cupric oxide layer. The thermal treatment in the reducing environment then reduces the cupric oxide to elemental copper. This leaves the exposed copper clean and in condition for further processing, such as electroless plating.

Figure 1:
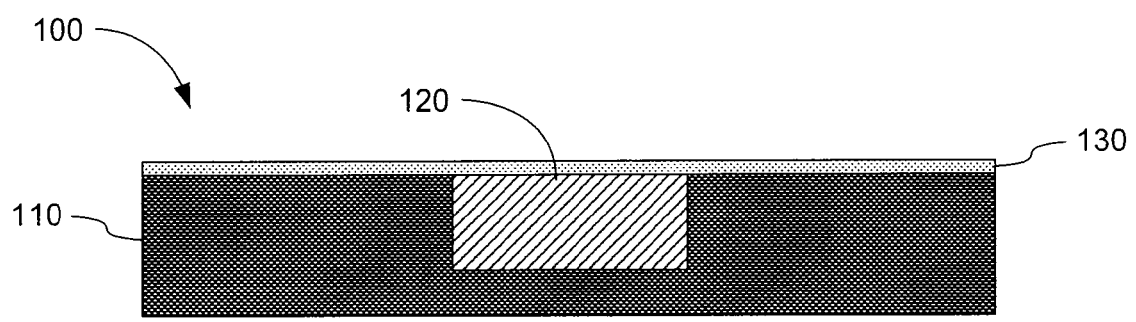
FIG. 1 is a cross-section view of a post-CMP wafer including a conductive feature disposed within a dielectric layer.

FIG. 1 is a cross-sectional view of a wafer 100 following a chemical mechanical polishing (CMP) process. The wafer 100 comprises a dielectric layer 110 and an exposed conductive feature 120 disposed within the dielectric layer 110. FIG. 1 also shows a residue layer 130 left by the CMP process on the surfaces of the dielectric layer 110 and the conductive feature 120. The residue layer 130 can include, for example, cleaning residues and corrosion inhibitors, which are typically copper-organic complexes. The residue layer 130 should be removed as completely as possible prior to further processing, such as electroless deposition on the conductive feature 120.

The dielectric layer 110 can comprise $SiO_2$ or a low dielectric constant ("low-k") material that has a dielectric constant less than that of $SiO_2$. Such low-k materials, especially those with dielectric constants lower than 3, are increasingly favored in semiconductor device fabrication as they impart superior electrical properties to the finished devices.

Examples of suitable low-k materials include fluorosilicate glass (FSG), organosilicateglass (OSG), and highly porous $SiO_2$.

The conductive feature 120 can be a conductive line or via made of copper, for example. Although only one conductive feature 120 is shown in FIG. 1, the conductive feature 120 is used to represent the large number of conductive features that are typically present on a wafer 100.

Figure 2:
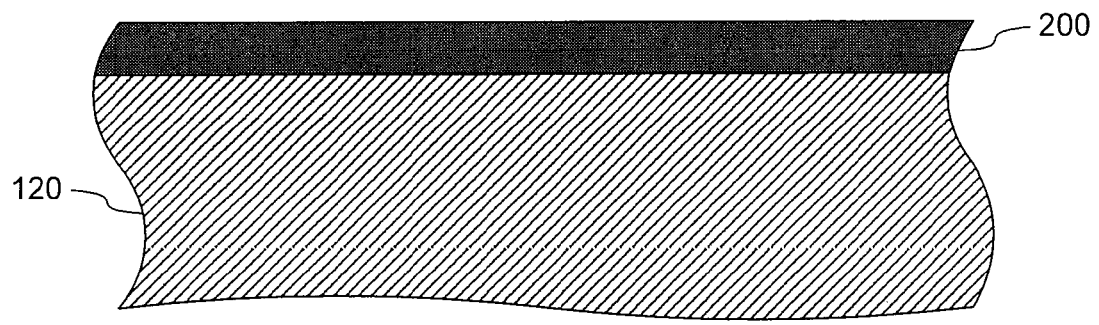
FIG. 2 is a cross-section view of the top portion of the conductive feature of FIG. 1.

FIG. 2 shows an enlarged view of a top portion of the conductive feature 120 in FIG. 1. The residue layer 130 has been omitted from FIG. 2 for clarity. As shown in FIG. 2, when the conductive feature 120 comprises copper, the CMP process leaves the conductive feature 120 with a thin surface layer 200 of cuprous oxide ($Cu_2O$).

Figure 3:
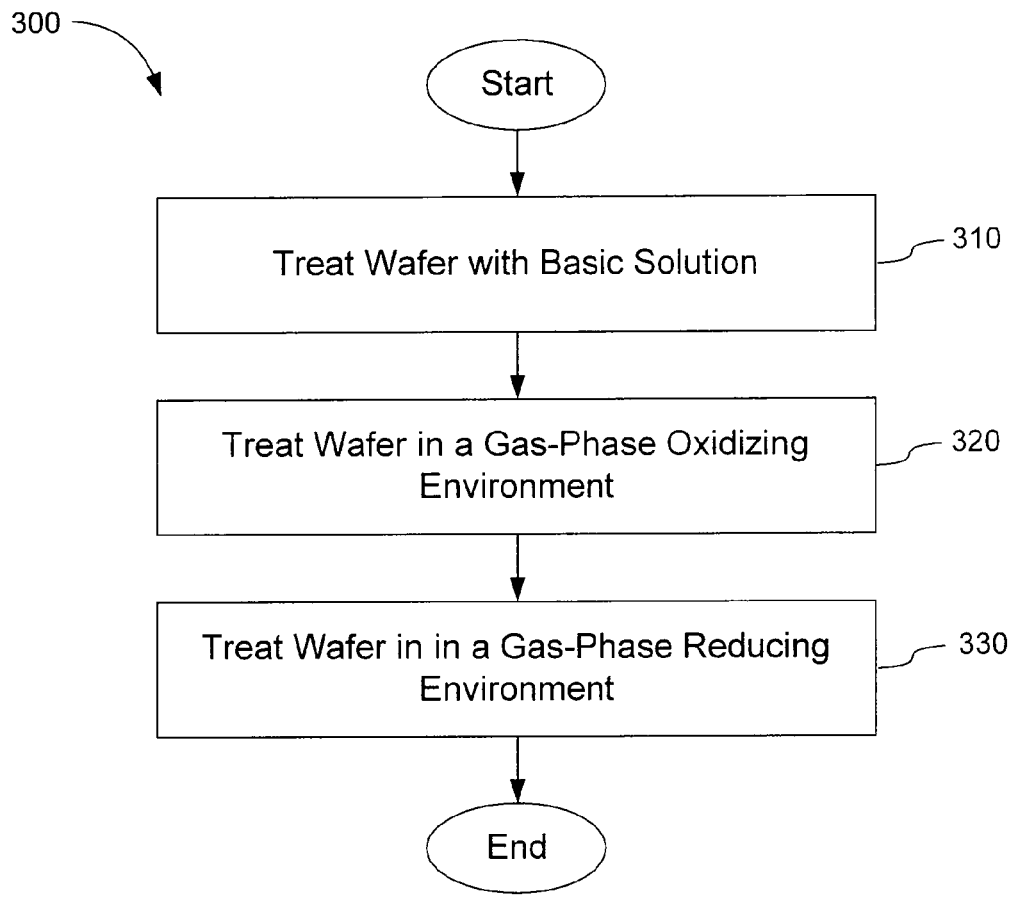
FIG. 3 is a flow-chart representation of a method for cleaning the post-CMP wafer of FIG. 1 according to an embodiment of the present invention.

FIG. 3 is a flow-chart representation of an exemplary method 300 for cleaning the wafer 100 to remove the residue layer 130. The method comprises optionally treating 310 the wafer 100 with a basic solution, treating 320 the wafer in a gas-phase oxidizing environment, and treating 330 the wafer in a gas-phase reducing environment. Here, "gas-phase" indicates that the phase of matter within the environment is a gas, as opposed to a plasma.

The method 300 optionally begins by treating 310 the wafer 100 with a basic solution. In some embodiments, the basic solution has a pH of 10; a suitable pH range for the basic solution is about 8 to about 11. An exemplary basic solution comprises tetramethyl ammonium hydroxide. A suitable dwell time in the basic solution under these conditions is about 30 seconds to about 2 minutes. Treating 310 the wafer 100 with the basic solution serves to remove a substantial portion of the residue layer 130 from the surface of the dielectric layer 110 and the surface of the conductive feature 120. In some embodiments, the treatment 310 leaves approximately a monolayer of the residue layer 130 on both the surface of the dielectric layer 110 and the surface of the conductive feature 120. Treating 310 with the basic solution does not meaningfully alter the $Cu_2O$ surface layer 200 (FIG. 2).

Next, the wafer 100 is treated 320 in an oxidizing environment. As treating 310 the wafer 100 with the basic solution is optional, in some embodiments the method 300 begins with treating 320 in the oxidizing environment. An exemplary oxidizing environment comprises an atmosphere including about 1% to about 10% molecular oxygen ($O_2$), or about 1% to about 2% ozone ($O_3$), with the balance of the atmosphere being an inert gas such as nitrogen, helium, or argon. All percentages used herein are volume percents unless noted otherwise.

A suitable temperature range for the oxidizing environment is about 100° C. to about 400° C. A more preferable temperature is in the range of about 150° C. to about 250° C. The pressure within the oxidizing environment can be at or below normal atmospheric pressure. An exemplary pressure is about 1 Torr. A suitable dwell time in the oxidizing environment under these conditions is about 2 minutes, but can be in the range of about 1 minute to about 5 minutes. Omitting the optional treating 310 the wafer 100 with the basic solution generally results in longer dwell times.

Figure 4:
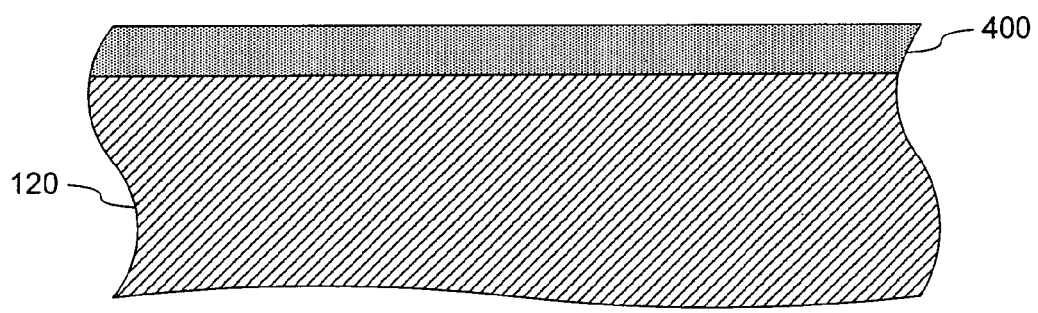
FIG. 4 is a cross-section view of the top portion of the conductive feature shown in FIG. 2 following treatment in an oxidizing environment according to an embodiment of the present invention.

Treating 320 in the oxidizing environment serves to decompose and volatilize the organic materials in the residue layer 130. The elevated temperature of the oxidizing environment also serves to desorb water in the residue layer 130. Additionally, the oxidizing environment serves to oxidize the $Cu_2O$ surface layer 200 of the conductive feature 120. As shown in FIG. 4, the $Cu_2O$ surface layer 200 (FIG. 2) is oxidized to form a cupric oxide (CuO) surface layer 400.

Next, the wafer 100 is treated 330 in a reducing environment. An exemplary reducing environment comprises an atmosphere including molecular hydrogen ($H_2$). The atmosphere can be essentially entirely hydrogen, or can comprise a mixture of hydrogen with an inert gas such as nitrogen, helium, or argon. The pressure within the reducing environment can be at or below normal atmospheric pressure. At normal atmospheric pressure, a suitable concentration of hydrogen is about 4%. At lower pressures, such as in the range of about 1 Torr to about 10 Torr, the atmosphere can be entirely hydrogen. A suitable temperature range for the reducing environment is about 100° C. to about 400° C. A more preferable temperature is in the range of about 150° C. to about 250° C. In some embodiments, the same temperature is maintained through both treatments 320 and 330. A suitable dwell time in the reducing environment under these conditions is about 1 minute to about 2 minutes.

Figure 5:
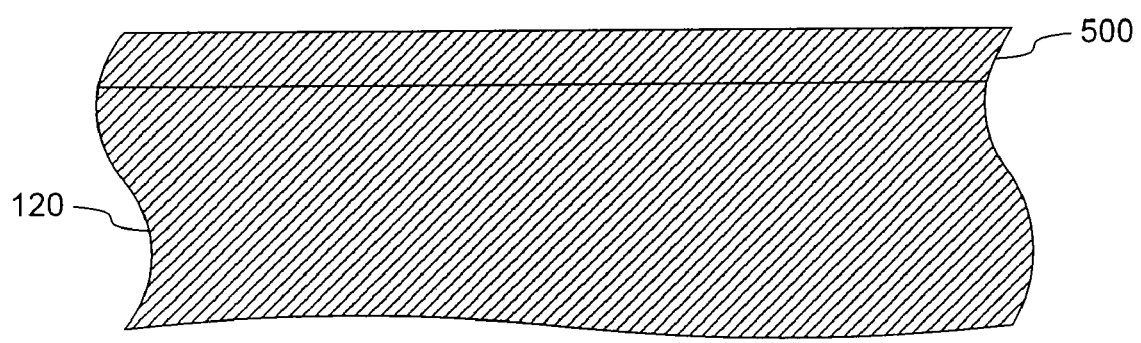
FIG. 5 is a cross-section view of the top portion of the conductive feature shown in FIG. 3 following treatment in a reducing environment according to an embodiment of the present invention.
Figure 6:
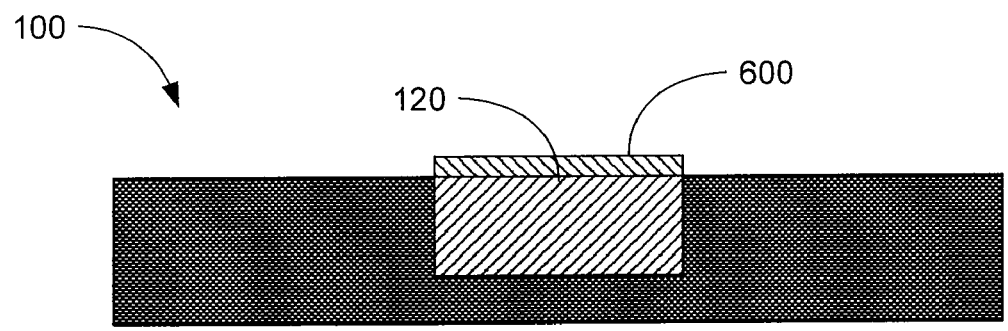
FIG. 6 is a cross-section view of a wafer including a capping layer selectively disposed on a conductive feature according to an embodiment of the present invention.

As shown in FIG. 5, treating 330 in the reducing environment serves to reduce the CuO surface layer 400 (FIG. 4) to a surface layer 500 of elemental copper (Cu). Following treating 330 in the reducing environment, the wafer 100 can be further processed, for example, by selective electroless plating of a capping layer on the conductive feature 120. Methods for electroless plating of cobalt and cobalt alloys are taught, for example in U.S. patent application Ser. No. 11/644,697 filed on Dec. 22, 2006 and entitled "Electroless Deposition of Cobalt Alloys," and U.S. patent application Ser. No. 11/513,634 filed on Aug. 30, 2006 and entitled "Processes and Systems for Engineering a Copper Surface for Selective Metal Deposition" each of which is incorporated herein by reference. FIG. 6 shows the wafer 100 after a capping layer 600 has been selectively formed on the conductive feature 120 by electroless plating. Advantageously, the elemental copper surface layer 500 provides a superior surface for the nucleation and growth of cobalt and cobalt alloy capping layers than the $Cu_2O$ surface layer 200.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive.

What is claimed is:

1. A method for selectively forming a capping layer over a conductive feature of a wafer, the method comprising:
   cleaning the wafer, including
      oxidizing a $Cu_2O$ surface layer of the conductive feature in a first gas-phase environment to form a CuO surface layer; then
      reducing the CuO surface layer in a second gas-phase environment to Cu; and
   forming the capping layer selectively over the conductive feature by electroless deposition.

2. The method of claim 1 wherein cleaning the wafer further includes, before oxidizing the $Cu_2O$ surface layer, treating the wafer with a basic solution.

3. The method of claim 1 wherein the capping layer comprises cobalt or a cobalt alloy.

* * * * *